United States Patent
Joyce et al.

(10) Patent No.: US 9,871,479 B2
(45) Date of Patent: Jan. 16, 2018

(54) FAULT DETECTION SYSTEM FOR ISOLATED TWO-SWITCH EXCITER DRIVE GATE DRIVER

(71) Applicant: Hamilton Sundstrand Corporation, Charlotte, NC (US)

(72) Inventors: Thomas P. Joyce, Loves Park, IL (US); Art Beneditz, Rockford, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 15/187,847

(22) Filed: Jun. 21, 2016

(65) Prior Publication Data
US 2017/0366125 A1 Dec. 21, 2017

(51) Int. Cl.
H02P 9/00 (2006.01)
H03K 3/017 (2006.01)
H02P 9/30 (2006.01)

(52) U.S. Cl.
CPC .............. *H02P 9/006* (2013.01); *H02P 9/305* (2013.01); *H03K 3/017* (2013.01)

(58) Field of Classification Search
CPC .......... H02P 9/006; H02P 9/305; H03K 3/017
USPC ......................................................... 322/99
See application file for complete search history.

(56) References Cited

U.S. PATENT DOCUMENTS

| | | | | |
|---|---|---|---|---|
| 4,486,801 | A * | 12/1984 | Jackovich | ............ H02H 7/065 322/59 |
| 5,850,138 | A | 12/1998 | Adams et al. | |
| 7,215,100 | B2 * | 5/2007 | Velhner | .................. H02P 9/102 322/25 |
| 8,503,146 | B1 * | 8/2013 | Shekhawat | ........ H03K 17/0812 361/93.9 |
| 9,685,955 | B2 * | 6/2017 | Choi | ............. H03K 19/017518 |
| 9,705,395 | B2 * | 7/2017 | Tomas | .................... H02M 1/32 |
| 2009/0285416 | A1 | 11/2009 | Guo et al. | |
| 2010/0164735 | A1 | 7/2010 | Hartman et al. | |
| 2013/0063400 | A1 | 3/2013 | Ahn et al. | |

FOREIGN PATENT DOCUMENTS

EP 0083714 A1 7/1983

OTHER PUBLICATIONS

Bruce Carter, "Buffer Op Amp to ADC Circuit Collection Appendix A: How to Choose a Reference", Mar. 30, 2002, XP055397959, Retrieved from the Internet: URL:http://www.ti.com/lit/an/sloa098/sloa098.pdf, retrieved on Aug. 10, 2017; pp. 1, 3 and 7.

(Continued)

*Primary Examiner* — Tulsidas C Patel
*Assistant Examiner* — Sean Gugger
(74) *Attorney, Agent, or Firm* — Cantor Colburn LLP

(57) ABSTRACT

A generator control unit (GCU) includes a fault detection system configured to generate a direct current (DC) voltage signal based on a difference of a DC-equivalent voltage between the positive and negative exciter gate drive signals. The fault detection system further outputs a fault detection signal indicating the fault status of the gate drive integrated circuits based on a comparison between the DC average voltage signal and a threshold value.

15 Claims, 4 Drawing Sheets

(56) References Cited

OTHER PUBLICATIONS

Copyright: "Isolated Gate Driver (ISO5852S 1GBT Gate Driver Reference Design for Parallel IGBTs With Short-Circuit protection and External BJT Buffer TI Designs IGBT Gate Driver Reference Design for Parallel IGBTs With Short-Circuit Protection and External BJT Buffer Design Folder IS058525 Product Folder ASK Ou", Jan. 31, 2016, XP055397741, Retrieved from Internet: URL:http://www.ti.com/lit/ug/tiduc70a/tiduc70a.pdf, p. 15.
European Search Report for 17177095.1, dated Sep. 12, 2017, 15 pages.

\* cited by examiner

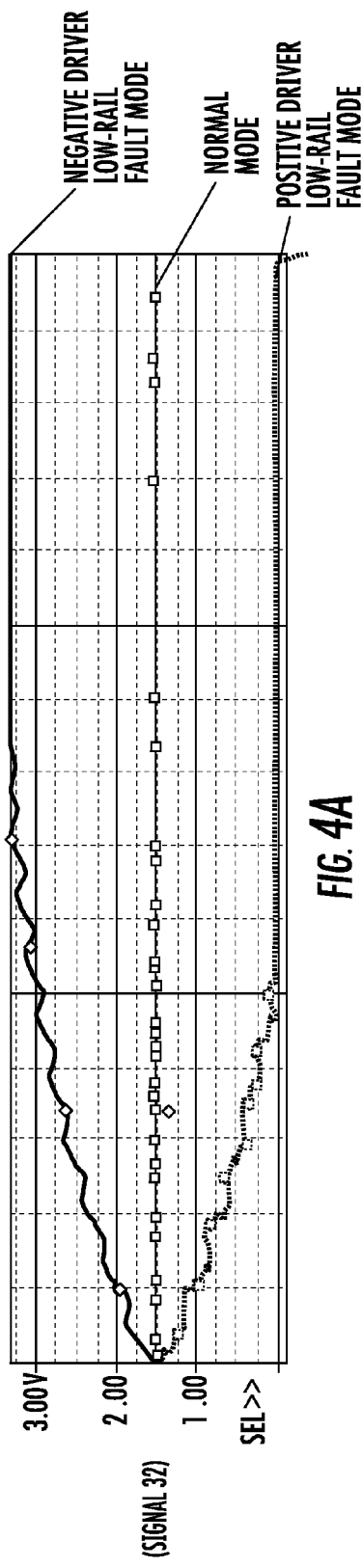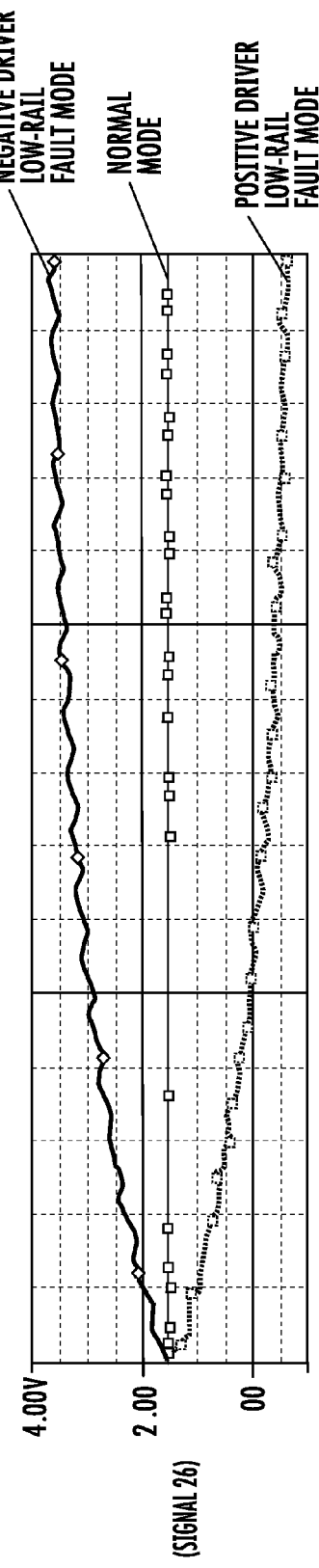

FAULT DETECTION SYSTEM FOR ISOLATED TWO-SWITCH EXCITER DRIVE GATE DRIVER

TECHNICAL FIELD

The present inventive teaching relate generally to aircraft electrical systems, and more specifically, to an aircraft electrical power generation system that includes a generator control unit (GCU).

BACKGROUND

A typical aircraft electrical power generation system (EPGS) includes a GCU configured to control the output voltage of an alternating-current (AC) electrical generator by means of an exciter drive.

As illustrated in FIG. 1, some versions of a GCU 100 may include a dual gate driver integrated circuit 102 that drives a two-switch, isolated exciter drive circuit 104 configured to energize a fixed exciter field winding (not shown). In normal operation, the two driver switches 106a-106b included in the dual gate driver circuit 102 operates 180 degrees out of phase with respect to one another during the on-time of the control pulse-width modulation (PWM) signal command used to regulate generator output voltage, while switching between a high voltage potential and a low voltage potential. The gate driver circuit 102 converts a first input voltage into a second higher output voltage. However, one of the two driver switches 106a-106b may experience a high rail fault or a low rail fault during which the faulty switch stays coupled to either the high voltage rail or the low voltage rail (see FIG. 2) as opposed to switching between the high voltage potential and the low voltage potential. This fault mode may remain dormant in the system and allow the generator to regulate output voltage properly, but cause additional stress in the exciter drive circuitry.

SUMMARY

According to a non-limiting embodiment, a generator control unit (GCU) includes a dual gate driver integrated circuit, a transformer-isolated two switch exciter driver, and a fault detection system. The dual gate driver integrated circuit is configured to receive a positive and negative input signal. Each of the positive and negative input signals comprises both a pulse-width-modulation (PWM) command signal and a higher frequency carrier signal, and converts these input signals into a positive exciter switch drive signal and a negative exciter switch drive signal. The transformer-isolated two-switch exciter driver is configured to output an exciter drive signal in response to receiving the positive and negative exciter switch drive signals. The fault detection system is configured to generate a direct current (DC) voltage signal based on the difference of a DC-equivalent voltage between the positive and negative exciter gate drive signals. The fault detection system further outputs a fault detection signal indicating the fault status of the gate drive integrated circuits based on a comparison between the DC average voltage signal and a threshold value.

According to another non-limiting embodiment, a method of detecting a fault mode of a gate drive integrated circuit that is part of the transformer-isolated two-switch exciter driver included in a GCU comprises converting, via a dual gate driver integrated circuit, positive and negative input signals, each of which comprises both a pulse-width-modulation (PWM) command signal and a higher frequency carrier signal, into a positive exciter switch drive signal and a negative exciter switch drive signal. The method further includes outputting, via a transformer-isolated two-switch exciter driver, an exciter drive signal for driving an exciter field winding in response to receiving the positive and negative exciter switch drive signals. The method further comprises generating a direct current (DC) voltage signal based on a difference between the DC-equivalent value of the positive and negative exciter gate drive signals. The method further includes outputting a fault detection signal indicating a fault status of gate drive integrated circuits implemented in the transformer-isolated two-switch exciter driver based on a comparison between the DC average voltage signal and a threshold value.

BRIEF DESCRIPTION OF THE DRAWINGS

The subject matter which is regarded as the present disclosure is particularly pointed out and distinctly claimed in the claims at the conclusion of the specification. The foregoing and other features, and advantages of the present disclosure are apparent from the following detailed description taken in conjunction with the accompanying drawings in which:

FIG. 4A is a signal diagram illustrating one example of the output of the voltage buffer stage of a gate driver fault detector circuit included in the fault detection system of FIG. 2 during a low-power rail fault mode of a gate driver integrated circuit according to a non-limiting embodiment; and FIG. 4B is a signal diagram illustrating one example of the output of the differential amplifier stage of a gate driver fault detector circuit included in the fault detection system of FIG. 2 during a low-power rail fault mode of a gate driver integrated circuit according to a non-limiting embodiment.

DETAILED DESCRIPTION

A two-switch, isolated exciter drive circuit used in a generator control unit (GCU) of an aircraft electrical power generation system (EPGS) may operate in a fault mode that can remain dormant and which can have a potentially significant impact on system reliability. The fault mode may occur when one of two gate driver integrated circuits remains coupled to the high-power rail or low-power rail and stops switching. Although a fault mode exists, the generator output voltage may still regulate properly, and therefore the fault mode is viewed as potentially dormant.

However, the switching exciter drive switches (not shown) included in the transformer-isolated 2-switch exciter drive circuit dissipate significantly more power which can cause undesirable over-heating of the exciter drive switches themselves and/or other areas of the GCU.

Various non-limiting embodiments described herein provide a fault detection system which is configured to detect a fault event of either of the gate driver integrated circuits that drive a two-switch, isolated exciter drive circuit implemented in a GCU. That is, the fault detection system according to at least one embodiment is configured to detect the dormant fault mode that exists in a conventional two-switch, isolated exciter drive circuit.

According to at least one embodiment, the fault detection system may be constructed as an analog sense circuit that is connected to an analog-to-digital converter (ADC) so that a fault detection logic element can determine whether or not either of the gate drivers is experiencing a fault event. The analog sense circuit may include a differential amplifier stage with a direct current (DC) offset voltage approximately equal to half of the ADC's input range. The differential amplifier stage has a low-pass filter such that a high frequency switching input signal is converted to a DC signal equal to the input signal's root mean square (RMS) value. In at least one embodiment, the gain of the differential amplifier stage is set such that for a minimal RMS value input signal, the output voltage will exceed the ADC's maximum input range. Accordingly, when the drivers are switching properly or not switching at all, the output voltage of the detection circuitry is approximately equal to the DC offset of the differential amplifier stage. When, however, either one of the drivers experiences a fault event (e.g., a short to the high-voltage rail or a short to the low-voltage rail), while the other remains switching between the high-rail and the low-rail, then the output voltage of the detection circuitry is approximately equal to the minimum or maximum allowable ADC input voltage. In this manner, the dormant fault mode of the two-switch, isolated exciter drive circuit can be detected.

Figure 1:
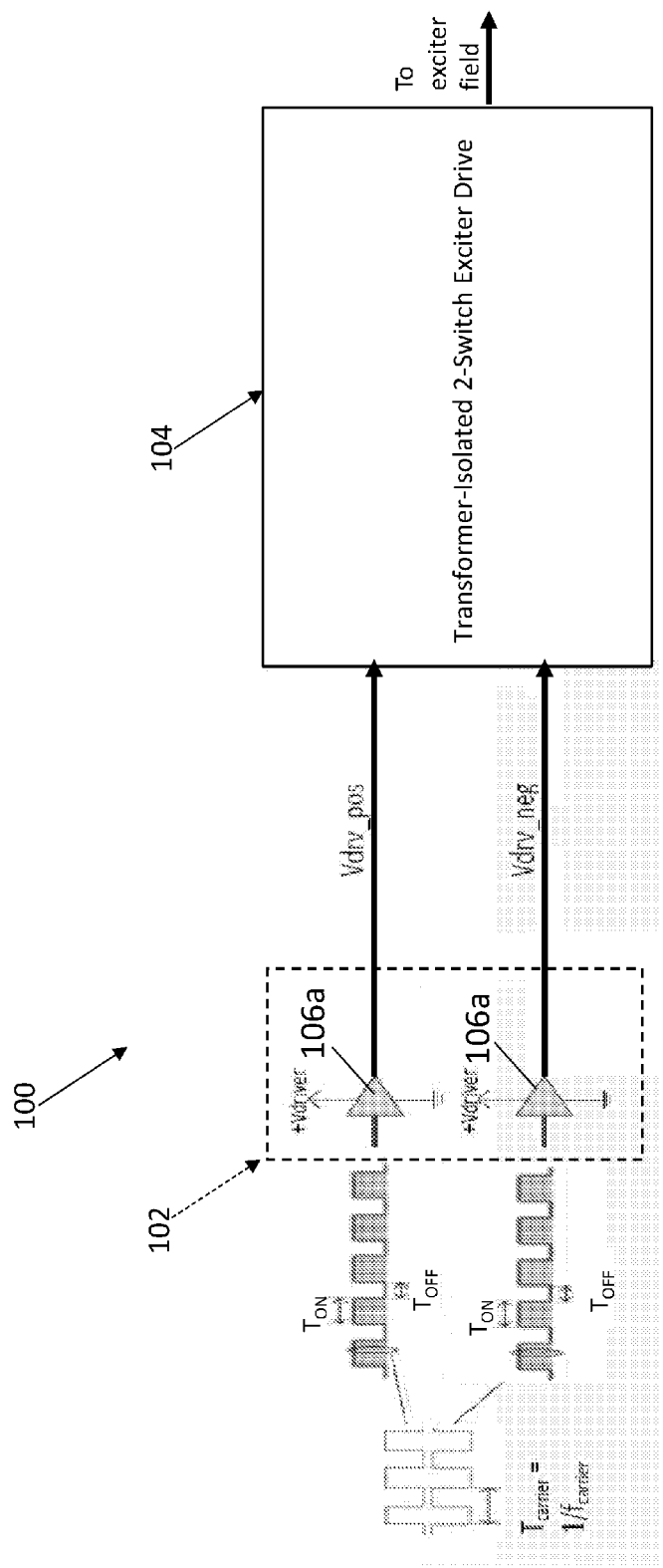
FIG. 1 is a block diagram illustrating a conventional GCU including a dual gate driver integrated circuit that drives a two-switch, isolated exciter drive circuit.
Figure 2:
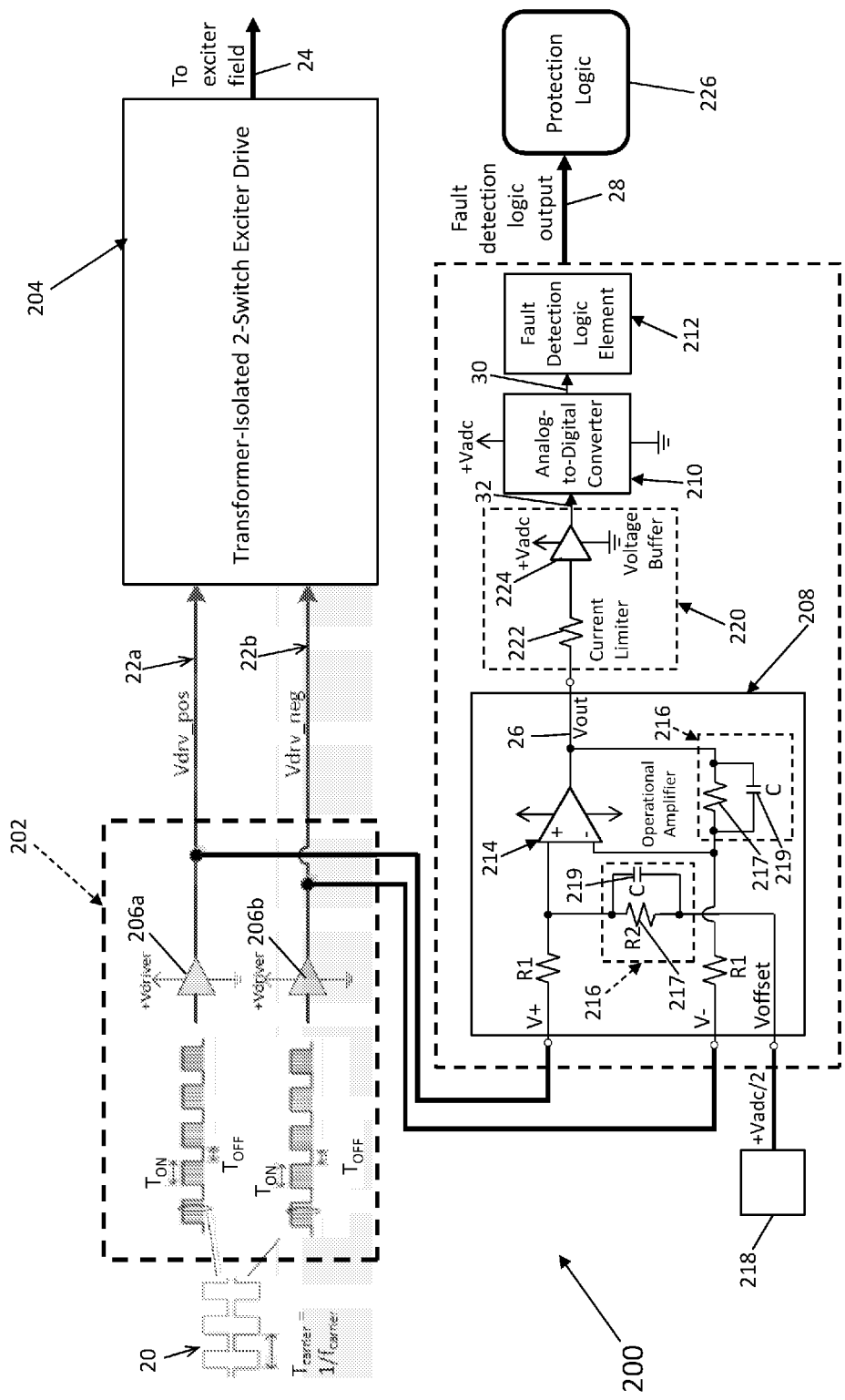
FIG. 2 is a block diagram illustrating a GCU including a fault detection system configured to detect a fault event of a dual gate driver integrated circuit that drives a two-switch, isolated exciter drive circuit according to a non-limiting embodiment.

Turning now to FIG. 2, a GCU 200 including a fault detection system 201 configured to detect a fault event of a dual gate driver integrated circuit 202 that drives a two-switch, isolated exciter drive circuit 204 is illustrated according to a non-limiting embodiment. The dual gate driver integrated circuit 202 receives an input carrier signal 20 and converts the input carrier signal 20 into a positive exciter gate drive signal 22a and a negative exciter gate drive signal 22b. In at least one embodiment, each of the input signals 22a-22b include comprises both a pulse-width-modulation (PWM) command signal and a higher frequency carrier signal. In at least one embodiment, the dual gate driver integrated circuit 202 includes a positive gate driver 206a that outputs the positive exciter switch drive signal 22a and a negative gate driver 206b that outputs the negative exciter switch drive signal 22b. During operation, the positive and negative gate drivers 206a-206b are toggled (i.e., switched) out of phase (approximately 180 degrees) with respect to one another during the on-time of the voltage regulation PWM command signal such that they switch at the relatively high frequency (e.g., 200 kHz) of the carrier signal during the on-time and are both low (voltage potential of the low power rail) during the off-time of the voltage regulation PWM command signal. The envelope of the gate driver output signals follow the voltage regulation PWM command input, which is a lower frequency (e.g., 1.2 kHz) than that of the carrier signal such that many out-of-phase driver switching cycles occur within the envelope of one command cycle. the period of the carrier signal ($T_{CARRIER}$) is defined as $1/f_{CARRIER}$, where $f_{CARRIER}$ is the frequency of the carrier signal 20. Accordingly, the positive and negative exciter gate drive signals 22a-22b may generate a differential voltage across a transformer unit (not shown) included in the transformer-isolated two-switch exciter driver 204.

The transformer-isolated two-switch exciter driver 204 is configured to receive the positive and negative exciter switch drive signals 22a-22b. Based on the positive and negative exciter switch drive signals 22a-22b, the transformer-isolated two-switch exciter driver 204 outputs an exciter drive current 24 that electrically excites and energizes an exciter field winding (not shown) included in the EPGS to induce an exciter field current. In at least one embodiment, the duty cycle (e.g., $duty_{DRIVE}=T_{ON}/(T_{ON}+T_{OFF})$) of the envelope of the positive and negative exciter switch drive signals 22a-22b is proportional to the exciter field current. In addition, the period of the envelope of each exciter switch drive signals 22a-22b may be defined as:

$$T_{ON}+T_{OFF}=T_{DRIVE}=1/f_{DRIVE},\qquad [1],\text{ where}$$

$T_{DRIVE}$ is the period of the envelope of a respective exciter switch drive signal 22a-22b; and $1/f_{DRIVE}$ is the frequency of the envelope of a respective exciter drive signal 22a-22b.

The fault detection system 201 is configured to generate a direct current (DC) voltage signal 26 based on the difference between the DC average of the positive and negative exciter switch drive signals 22a-22b. The DC signal 26 is then buffered and voltage-limited to the minimum and maximum value of the ADC's input range to create signal 32. The buffered signal 32 may then be used to determine an operating mode (e.g., normal mode or fault mode) of the exciter gate drivers 202. The fault detection system 201 may also output a fault status signal 28 indicating the operating mode of the exciter gate drivers 202 based on comparison between the buffered DC voltage signal 32 and a threshold value.

According to a non-limiting embodiment, the fault detection system 201 includes a driver switch fault detector circuit 208/220, an analog-to-digital converter (ADC) circuit 210, and a fault detection logic element 212. The exciter gate driver fault detector subcircuit 208 outputs the DC voltage signal 26 based on the difference between the DC average of the positive and negative exciter switch drive voltage signals 22a/22b. In at least one embodiment, the driver switch fault detector subcircuit 208 is implemented as a differential amplifier using an operational amplifier 214 and a low-pass filter circuit. The low-pass filter circuit may include one or more low-pass filters 216 as shown in FIG. 2.

The differential amplifier 208 includes a first input (e.g., a positive input) and a second input (e.g., a negative input). The positive input (+) is connected to the output of the positive gate driver 206a. The differential amplifier output voltage 26 is offset by a fixed DC voltage offset by referencing the positive input portion of the amplifier to a voltage source 218. In this manner, the positive input (+) receives the positive exciter switch drive signal 22a and a voltage offset ($V_{OFFSET}$). The configuration filters the positive input signal to extract a DC average of the positive gate drive signal. In at least one embodiment, the voltage offset source provides an offset voltage that is approximately half the source voltage (e.g., $V_{ADC}/2$) delivered to the ADC 210. The negative input (−) is connected to the output of the negative gate driver 206b so as to receive the negative exciter switch drive signal 22b. The negative input is also filtered equivalently to extract the DC average of the negative gate drive signal. The output ($V_{OUT}$) of the differential amplifier 214 may be defined as:

$$V_{OUT}=[(DC(V+)-DC(V-))*(R2/R1)]+V_{OFFSET}$$

$$DC(V+)|_{during\ excitation\ with\ no\ fault}$$

$$=V\text{driver*[carrier signal duty cycle]*[command signal duty cycle]}$$

$$=V\text{driver}*50\%*[T_{ON}/T_{DRIVE}]$$

$$DC(V+)|_{Vdrv\_pos\ fault\ high}=V\text{driver}$$

$$DC(V+)|_{Vdrv\_pos\ fault\ low}=0$$

$$DC(V-)|_{during\ excitation\ with\ no\ fault}$$

$$=V\text{driver*[carrier signal duty cycle]*[command signal duty cycle]}$$

$$=V\text{driver}*50\%*[T_{ON}/T_{DRIVE}]$$

$$DC(V-)|_{Vdrv\_neg\ fault\ high}=V\text{driver}$$

$$DC(V-)|_{Vdrv\_pos\ fault\ low}=0 \qquad [2], \text{where}$$

The low-pass filter 216 includes paralleled R-C network between the operational amplifier's output and its inverting input and an identical paralleled R-C network from its non-inverting input to the DC voltage offset as further illustrated in FIG. 2. The RC low-pass filter includes a resistor (R2) 217 connected in parallel with a capacitor (C) 219. In this manner, the low-pass filter 216 filters the switching input signals 22a-22b by extracting their DC-equivalent value to generate the DC voltage signal 26.

According to a non-limiting embodiment, the low-pass filter is designed to implement a pole that occurs at a frequency ($f_{c,low-pass}$) that is set to more than a decade below the lowest input signal frequency ($f_{DRIVE}$). That is, $f_{c,low-pass}=1/(2*\pi*R2*C)$, where $f_{c,low-pass}$ is less than ($f_{DRIVE}/10$).

The ADC 210 receives the buffered and voltage-limited DC voltage signal 32 and outputs a digital signal 30 indicative of the DC voltage signal. The ADC circuit 210 may be constructed according to various ADC circuits understood by one of ordinary skill in the art. In at least one embodiment, a buffer stage 220 is connected in series with the output of the differential amplifier 208 and the input of the ADC 210. A buffering stage 220 may be connected at the output of the differential amplifier stage so as to limit the differential amplifier output signal range within the ADC's input range. The buffer state 220 may include, for example, a current limiter 222 connected in series with a voltage buffer 224. A first end of the current limiter 222 is connected to the output of the differential amplifier 208 while the second end of the current limiter 222 is connected to the input of the voltage buffer 224. The voltage buffer 224 receives a source input ($V_{ADC}$) having a value equal to or approximately equal to the ADC source voltage ($V_{ADC}$). Accordingly, the buffered output signal 32 generated by the voltage buffer 224 limits the range of the differential amplifier output signal 26 to the input range corresponding to the ADC 210.

The exciter gate drive fault detection logic element 212 compares the digital signal 30 to a threshold value, and determines the operating mode of the exciter gate drivers 202. The gate drive fault detection logic element 212 may be constructed as a microcontroller, for example, having a memory and a hardware processor. The memory may store software and/or various algorithms that, when executed by the processor, allows the gate drive fault detection logic element 212 to analyze the digital signal 30 and in turn identify the operating mode of the transformer-isolated two-switch exciter driver 204.

During normal operation, i.e., when the positive and negative gate drivers 206a-206b are switching properly or properly turned off, the output voltage of the differential amplifier stage 208 of the fault detection system 201 is approximately equal to the DC offset ($V_{OFFSET}$) (i.e., a first threshold value or static nominal value) of the differential amplifier 208. As illustrated in FIGS. 3B-4B, the DC voltage signal 26 remains steady at approximately Voffset=Vadc/2. Similarly, the buffered signal 32 input to the ADC 210 remains steady at approximately Voffset=Vadc/2. Selecting an offset voltage of Vadc/2 (the midpoint between the minimum and maximum allowed ADC input voltage) gives optimal signal range to distinguish a fault from a non-fault.

When, however, either one of the gate drivers 206a-206b experiences a high-voltage rail fault or a low-voltage rail fault while the other is switching, then the output voltage of the gate driver fault detector differential amplifier circuit 208 (signal 26) is approximately equal to the minimum or maximum allowable ADC input voltage. That is, if either gate driver 206a-206b is short-circuited to the high-voltage rail or the low-voltage rail, then the DC-equivalent value of the faulty input signal becomes equal to 0 V or to $V_{DRIVER}$, which causes the output voltage 26 to transition away from $V_{OFFSET}$ per the output voltage equation above. In at least one embodiment, the gain ratio (R2/R1) is set such that the output voltage 26 becomes either less than 0 V or greater than $V_{ADC}$ when either gate driver 206a-206b experiences a high-voltage rail fault or a low-voltage rail fault, for all possible operational duty cycles (e.g., from 50% to 100%). Based on detection during 50% duty cycle operation with one driver experiencing a low-fault the following equation is realized:

$$(R2/R1)>(V_{ADC}/V_{DRIVER})*2 \qquad [4], \text{where}$$

Figure 3A:
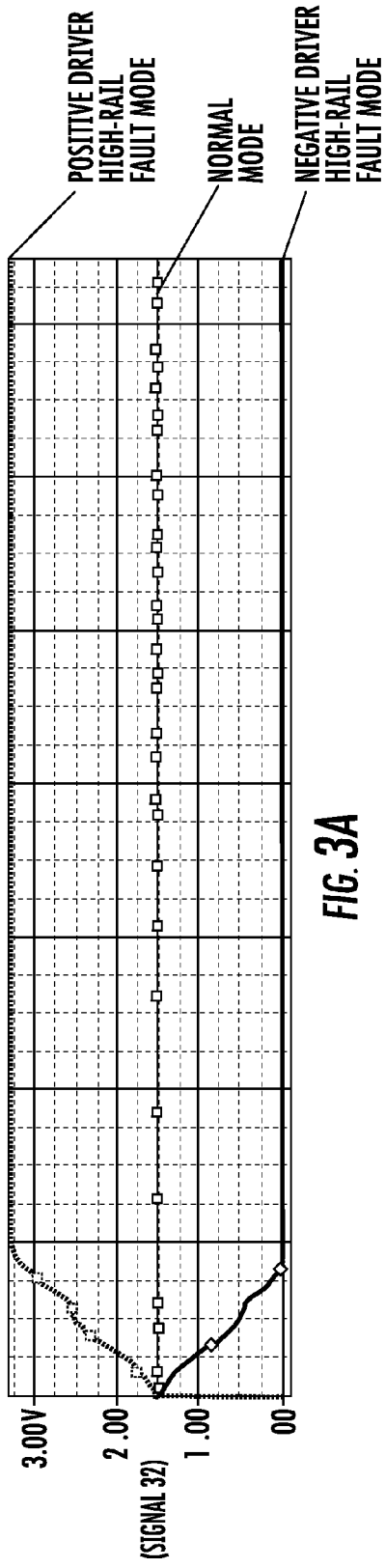
FIG. 3A is a signal diagram illustrating one example of the output of the voltage buffer stage of a gate driver fault detector circuit included in the fault detection system of FIG. 2 during a high-power rail fault mode of a gate driver integrated circuit according to a non-limiting embodiment.
Figure 3B:
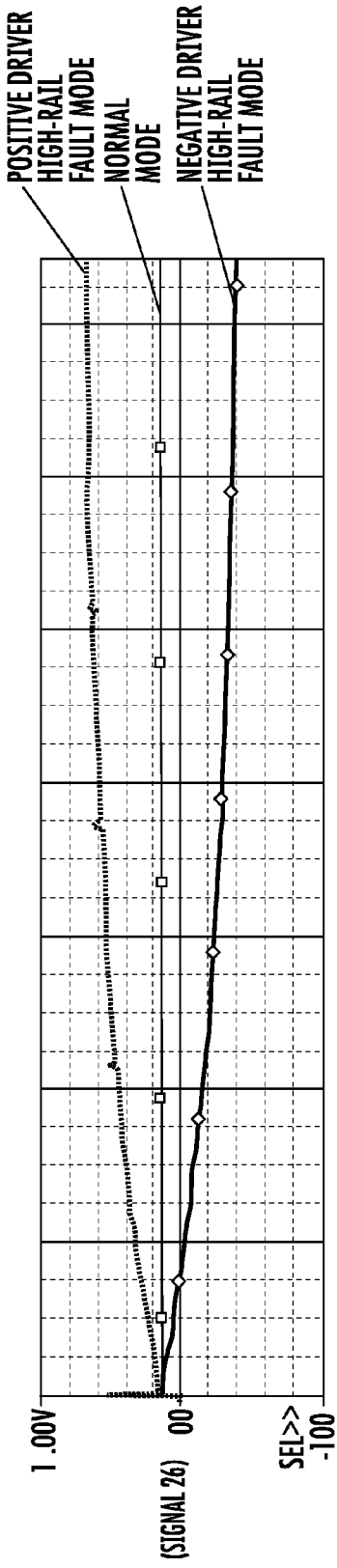
FIG. 3B is a signal diagram illustrating one example of the output of the differential amplifier stage of a gate driver fault detector circuit included in the fault detection system of FIG. 2 during a high-power rail fault mode of a gate driver integrated circuit according to a non-limiting embodiment.

R2/R1 is the gain ratio of the gate driver fault detector differential amplifier 208;

$V_{ADC}$ is the supply voltage of the analog-to-digital converter; and $V_{DRIVER}$ is the supply voltage of the gate driver integrated circuits An example of when either one of the positive or negative gate drivers 206a/206b experiences a high-voltage rail fault is illustrated in FIGS. 3A-3B. The input to the ADC 210 is illustrated in FIG. 3A whereas the output of the differential amplifier 208 is illustrated in FIG. 3B. Similarly, an example of when either one of the positive or negative gate drivers 206a experiences a low-voltage rail fault is illustrated in FIGS. 4A-4B. The input to the ADC 210 during the low-voltage fault mode is illustrated in FIG. 4A whereas the output of the differential amplifier 208 during the low-voltage fault mode is illustrated in FIG. 4B.

According to at least one embodiment, the exciter gate drive fault detection logic element 212 is in signal communication with protection logic 226. The protection logic includes, for example, a hardware controller to automatically perform various logic processes and comparison operations. In at least one embodiment, a graphic user interface (GUI) (not shown) may be in signal communication to generate various alerts (graphical, sound, illumination, physical vibration, etc.) in response to one or more commands output from the protection logic 226 Based on the comparison between the digitized DC voltage indicated by the digital signal 30 and the threshold value, the exciter gate drive fault detection logic element 212 may output the fault detection signal 28 indicating the fault status of the exciter gate drive integrated circuits 206a/206b. In response to the fault detection signal 28, the protection logic 226 may automatically generate one or more alerts indicating the current operating mode. When, however, the mode detection signal 28 indicates that transformer-isolated two-switch exciter driver 204 is operating in a fault mode (e.g., a gate driver high-power fault mode or a gate driver low-power fault mode).

As described in detail above, various non-limiting embodiment provides a fault detection system capable of detecting any of four fault modes of the gate driver integrated circuits in a two-switch, isolated exciter drive circuit 204, which is caused by either one of the gate drivers be shorted or coupled to the high-voltage rail or the low-voltage rail. In addition, the two-switch, isolated exciter drive circuit 204 may continue to provide proper generator control to maintain system operations until a future time period during which the fault indicated by the fault detection system can be resolved.

As used herein, the term "module" or "unit" refers to an application specific integrated circuit (ASIC), an electronic circuit, a hardware controller, an electronic computer processor (shared, dedicated, or group) and memory that executes one or more software or firmware programs, a combinational logic circuit, and/or other suitable components that provide the described functionality. When implemented in software, a module can be embodied in memory as a non-transitory machine-readable storage medium readable by a processing circuit and storing instructions for execution by the processing circuit for performing a method.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

The invention claimed is:

1. A generator control unit (GCU), comprising:
   a dual gate driver integrated circuit configured to receive a positive and negative input signal, each of which comprises both a pulse-width-modulation (PWM) command signal and a higher frequency carrier signal, and convert these input signals into a positive exciter switch drive signal and a negative exciter switch drive signal;
   a transformer-isolated two-switch exciter driver configured to output an exciter drive signal in response to receiving the positive and negative exciter switch drive signals; and
   a fault detection system configured to generate a direct current (DC) voltage signal based on the difference of a DC-equivalent voltage between the positive and negative exciter gate drive signals and to output a fault detection signal indicating the fault status of the gate drive integrated circuits based on a comparison between the DC voltage signal and a threshold value.

2. The GCU of claim 1, wherein the dual gate driver integrated circuit includes a positive gate driver that outputs the positive exciter switch drive signal and a negative gate driver that outputs the negative exciter switch drive signal.

3. The GCU of claim 2, wherein the positive and negative gate drivers are switched 180 degrees out of phase with respect one another during an on-time of the PWM command signal.

4. The GCU of claim 2, wherein the fault detection system comprises:
   a driver switch fault detector circuit that receives the positive and negative exciter switch drive signals and outputs the DC voltage signal based on the difference between a DC-equivalent value of the positive and negative exciter gate drive signals;
   an analog-to-digital converter circuit that receives the DC voltage signal and outputs a digital signal indicative of the DC voltage signal; and
   an exciter drive fault detection logic element that compares the digital signal to the threshold value, determines the fault status of an exciter gate drive integrated circuits based on the comparison, and outputs the fault detection signal indicating the fault status.

5. The GCU of claim 4, wherein the driver switch fault detector circuit comprises:
   a differential amplifier including a first input that receives the positive exciter gate drive signal and a second input that receives the negative exciter gate drive signal; and
   a low-pass filter that filters gate drive input signals to generate a DC output voltage signal proportional to the difference between the DC-equivalent value of the positive and negative inputs.

6. The GCU of claim 5, further comprising a buffer stage connected between the output of the gate drive fault detector differential amplifier circuit and the input of the analog-to-digital converter circuit, the buffer stage configured to output a buffered output signal that limits the range of the output of the gate drive fault detector circuit to an input range corresponding to the analog-to-digital converter circuit.

7. The GCU of claim 6, wherein the buffer stage comprises:
   a current limiter including a first end that is connected to the output of the differential amplifier; and
   a voltage buffer including an input terminal that is connected to an opposing end of the current limiter and output terminal that is connected to an input of the analog-to-digital converter circuit, the voltage buffer configured to receive a supply input having a value equal to or approximately equal to a supply voltage applied to the analog-to-digital converter circuit.

8. The GCU of claim 5, wherein the low-pass filter is designed to implement a pole that occurs at a frequency that is set to more than a decade below a PWM command frequency of the positive and negative exciter gate drive signals.

9. A method of detecting a fault mode of a gate drive integrated circuit that is part of a transformer-isolated two-switch exciter driver included in a GCU, the method comprising:
   converting, via a dual gate driver integrated circuit, positive and negative input signals, each of which comprises both a pulse-width-modulation (PWM) command signal and a higher frequency carrier signal, into a positive exciter switch drive signal and a negative exciter switch drive signal;
   outputting, via a transformer-isolated two-switch exciter driver, an exciter drive signal for driving an exciter field winding in response to receiving the positive and negative exciter switch drive signals;

generating a direct current (DC) voltage signal based on a difference between the DC-equivalent value of the positive and negative exciter gate drive signals; and outputting a fault detection signal indicating a fault status of gate drive integrated circuits implemented in the transformer-isolated two-switch exciter driver based on a comparison between the DC voltage signal and a threshold value.

10. The method of claim 9, wherein a positive exciter gate drive signal is generated via a positive gate driver, and the negative exciter switch drive signal is generated via a negative gate driver.

11. The method of claim 10, further comprising switching the positive and negative gate drivers 180 degrees out of phase with respect one another during an on-time of the PWM command signal.

12. The method of claim 10, further comprising:
outputting the DC voltage signal, via a gate drive fault detector circuit, based on the positive and negative exciter switch drive signals;

converting, via an analog-to-digital converter, the DC voltage signal into a digital signal indicative of the DC voltage signal;

comparing, via an exciter gate drive fault detection logic element, the digital signal to the threshold value; and determining, via the exciter drive fault detection logic element, the fault status of the gate drive integrated circuits which are part of the transformer-isolated two-switch exciter driver based on the comparison.

13. The method of claim 12, wherein outputting the DC voltage signal includes:
inputting the positive exciter gate drive signal to a first input of a differential amplifier;

inputting the negative exciter switch drive signal to a second input of the differential amplifier; and filtering each input signal to the differential amplifier to generate the DC voltage output signal.

14. The method of claim 13, further comprising buffering the output voltage signal generated by the differential amplifier so as to limit the range of the output of a differential amplifier portion of the gate drive fault detector circuit to an input range corresponding to the analog-to-digital converter circuit.

15. The method of claim 9, further comprising generating at least one of a protection logic element or a means of generating a fault message in response to detecting an exciter gate driver integrated circuits within the transformer-isolated two-switch exciter driver is operating in a fault mode.

* * * * *